US012652923B2

(12) United States Patent
Cho

(10) Patent No.: US 12,652,923 B2
(45) Date of Patent: Jun. 9, 2026

(54) DISPLAY DEVICE WITH RGB PIXEL CONFIGURATION

(71) Applicant: ELECTRONICS AND TELECOMMUNICATIONS RESEARCH INSTITUTE, Daejeon (KR)

(72) Inventor: Hyunsu Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 370 days.

(21) Appl. No.: 18/336,186

(22) Filed: Jun. 16, 2023

(65) Prior Publication Data

US 2024/0057429 A1     Feb. 15, 2024

(30) Foreign Application Priority Data

Aug. 11, 2022     (KR) ........................ 10-2022-0100575

(51) Int. Cl.
*H10K 59/35*          (2023.01)
*H10K 59/38*          (2023.01)

(52) U.S. Cl.
CPC ........... *H10K 59/353* (2023.02); *H10K 59/38* (2023.02)

(58) Field of Classification Search
CPC .............................. H10K 59/353; H10K 59/38
See application file for complete search history.

(56) References Cited

U.S. PATENT DOCUMENTS

| 7,816,677 B2 | 10/2010 | Lee et al. |
| 8,779,453 B2 | 7/2014 | Kurata et al. |
| 9,793,515 B2 | 10/2017 | Choi et al. |
| (Continued) | | |

FOREIGN PATENT DOCUMENTS

| KR | 20060055098 A | 5/2006 |
| KR | 10-2009-0105153 A | 10/2009 |
| (Continued) | | |

OTHER PUBLICATIONS

Cho et al., 10-2021-0005345, machine translation Jan. 2022 (Year: 2022).*

(Continued)

*Primary Examiner* — Tracie Y Green
(74) *Attorney, Agent, or Firm* — Rabin & Berdo, P.C.

(57)     ABSTRACT

Provided is a display device. The display device includes a substrate and a first pixel and a second pixel, which are disposed adjacent to each other in a first direction parallel to a top surface of the substrate. Each of the first pixel and the second pixel is provided in plurality and is alternately and repeatedly arranged in the first direction. The first pixel includes a first sub-pixel, a second sub-pixel, and a third sub-pixel, which are sequentially arranged in the first direction. The second pixel includes a fourth sub-pixel, a fifth sub-pixel, and a sixth sub-pixel, which are sequentially arranged in the first direction. The first to third sub-pixels include sub-pixels having colors different from each other. The fourth to sixth sub-pixels include sub-pixels having colors different from each other. The third sub-pixel and the fourth sub-pixel include sub-pixels that are disposed adjacent to each other and have the same color. Each of the second sub-pixel and the fourth sub-pixel includes a blue sub-pixel.

12 Claims, 9 Drawing Sheets

(56) References Cited

U.S. PATENT DOCUMENTS

| | | |
|---|---|---|
| 10,090,367 B2 | 10/2018 | Choi et al. |
| 10,665,640 B2 | 5/2020 | Zhu |
| 11,430,836 B2 | 8/2022 | Cho et al. |
| 2021/0005670 A1* | 1/2021 | Cho ..................... H10K 59/352 |
| 2021/0036067 A1* | 2/2021 | Kim ..................... H10K 59/353 |
| 2022/0020827 A1* | 1/2022 | Liu ..................... H10K 59/122 |
| 2024/0315075 A1* | 9/2024 | Wan ..................... H10K 59/121 |

FOREIGN PATENT DOCUMENTS

| | | | |
|---|---|---|---|
| KR | 10-1386828 B1 | 4/2014 | |
| KR | 10-1686715 B1 | 12/2016 | |
| KR | 10-2017-0060216 A | 6/2017 | |
| KR | 10-2021-0005345 A | 1/2021 | |
| KR | 20210005345 A * | 1/2021 | ............. H10K 50/11 |

OTHER PUBLICATIONS

Amalkumar Ghosh et al., "Ultra-High-Brightness 2K×2K Full-Color OLED Microdisplay Using Direct Patterning of OLED Emitters", SID 2017 DIGEST, pp. 226-229, May 2017.

* cited by examiner

DISPLAY DEVICE WITH RGB PIXEL CONFIGURATION

CROSS-REFERENCE TO RELATED APPLICATIONS

This U.S. non-provisional patent application claims priority under 35 U.S.C. § 119 of Korean Patent Application No. 10-2022-0100575, filed on Aug. 11, 2022, the entire contents of which are hereby incorporated by reference.

BACKGROUND

The present disclosure herein relates to a display device.

Currently, virtual reality (VR) devices and augmented reality (AR) devices are in the limelight as next-generation displays. As displays used for the above-described devices, micro displays are receiving a lot of attention. The micro displays may be largely classified into liquid crystal on silicon (LCoS) using a liquid crystal and OLED on Silicon (OLEDoS) using an organic light-emitting diode (OLED). In the case of the OLEDoS, a CMOS process is required to form fine pixels, and OLED elements are formed on electrodes formed by the CMOS process. In the OLEDoS, to implement each of red, green, and blue colors, there is a method for generally manufacturing a white OLED to implement each color through a color filter.

SUMMARY

The present disclosure provides a pixel arrangement and a structure of a display device having high resolution.

An embodiment of the inventive concept provides a display device including: a substrate; and a first pixel and a second pixel, which are disposed adjacent to each other in a first direction parallel to a top surface of the substrate, wherein each of the first pixel and the second pixel is provided in plurality and is alternately and repeatedly arranged in the first direction, the first pixel includes a first sub-pixel, a second sub-pixel, and a third sub-pixel, which are sequentially arranged in the first direction, and the second pixel includes a fourth sub-pixel, a fifth sub-pixel, and a sixth sub-pixel, which are sequentially arranged in the first direction, wherein the first to third sub-pixels include sub-pixels having colors different from each other, and the fourth to sixth sub-pixels include sub-pixels having colors different from each other, the third sub-pixel and the fourth sub-pixel include sub-pixels that are disposed adjacent to each other and have the same color, and each of the second sub-pixel and the fourth sub-pixel includes a blue sub-pixel.

In an embodiment, the first sub-pixel and the sixth sub-pixel may include sub-pixels having the same color, wherein each of the first sub-pixel and the sixth sub-pixel may include one of a red sub-pixel and a green sub-pixel, and each of the third sub-pixel and the fourth sub-pixel may include the other of the red sub-pixel and the green sub-pixel.

In an embodiment, the first pixel may be continuously and repeatedly arranged in a second direction which is parallel to the top surface of the substrate and crosses the first direction, and the second pixel may be continuously and repeatedly arranged in the second direction.

In an embodiment of the inventive concept, a display device includes: a substrate including a first pixel area and a second pixel area, which correspond to a first pixel and a second pixel, respectively, wherein the first pixel area and the second pixel area are alternately and repeatedly disposed in a first direction parallel to a top surface of the substrate; a first pixel electrode, a second pixel electrode, and a third pixel electrode on the first pixel area, which correspond to a first sub-pixel, a second sub-pixel, and a third sub-pixel, which are disposed in the first direction, respectively, wherein the first pixel includes the first sub-pixel, the second sub-pixel, and the third sub-pixel; a fourth pixel electrode, a fifth pixel electrode, and a sixth pixel electrode on the second pixel area, which correspond to a third sub-pixel, a fourth sub-pixel, and a fifth sub-pixel, which are disposed in the first direction, respectively, wherein the second pixel includes the third sub-pixel, the fourth sub-pixel, and the fifth sub-pixel; a blue emission layer on the first to sixth pixel electrodes; one of a red emission pattern and a green emission pattern on the blue emission layer; and a common electrode vertically spaced apart from the first to sixth pixel electrodes with the blue emission layer therebetween, wherein the third pixel electrode and the fourth pixel electrode are disposed adjacent to each other, and the one of the red emission pattern and the green emission pattern vertically overlaps the third pixel electrode and the fourth pixel electrode, and the other of the red emission pattern and the green emission pattern continuously extends from the first pixel area to the second pixel area.

In an embodiment, the first to third sub-pixels may include sub-pixels having colors different from each other, and the fourth to sixth sub-pixels may include pixels having colors different from each other, the third sub-pixel and the fourth sub-pixel may include pixel which are disposed adjacent to each other and have the same color, and each of the second sub-pixel and the fourth sub-pixel may include a blue sub-pixel.

In an embodiment, each of the first sub-pixel and the sixth sub-pixel may include one of a red sub-pixel and a green sub-pixel, and each of the third sub-pixel and the fourth sub-pixel may include the other of the red sub-pixel and the green sub-pixel.

In an embodiment, a width of the one of the red emission pattern and the green emission pattern in the first direction may be greater twice than a pixel pitch of each of the first to sixth sub-pixels in the first direction.

In an embodiment, the display device may further include the other of the red emission pattern and the green emission pattern on the blue emission layer, wherein the second pixel electrode and the fourth pixel electrode may not vertically overlap the red emission pattern and the green emission pattern.

In an embodiment, the display device may further include a resonance control pattern between the third and fourth pixel electrodes and the blue emission layer, wherein the resonance control pattern may vertically overlap the one of the red emission pattern and the green emission pattern.

In an embodiment, the display device may further include one of a red conversion pattern and a green conversion pattern on the common electrode, wherein, in a planar respective, the one of the red emission pattern and the green emission pattern may be spaced apart from the one of the red conversion pattern and the green conversion pattern in the first direction.

In an embodiment, a first width of the one of the red emission pattern and the green emission pattern in the first direction may be substantially the same as a second width of the one of the red conversion pattern and the green conversion pattern in the first direction.

In an embodiment, the display device may further include a resonance control pattern between the first, second, fifth, and sixth pixel electrodes and the blue emission layer, wherein a third width of the resonance control pattern in the first direction may be greater about twice than each of the first width and the second width.

In an embodiment, the display device may further include the other of the red emission pattern and the green emission pattern on the blue emission layer, wherein the second pixel electrode and the fourth pixel electrode may not vertically overlap the red emission pattern and the green emission pattern.

In an embodiment, the display device may further include a reflection control layer on the common electrode, wherein the reflection control layer may vertically overlap the one of the red emission pattern and the green emission pattern.

In an embodiment, the display device may further include color conversion patterns on the common electrode, wherein the color conversion patterns may vertically overlap the first pixel electrode and the sixth pixel electrode and are spaced apart from each other in the first direction, and the second pixel electrode and the fourth pixel electrode may not vertically overlap the one of the red emission pattern and the green emission pattern and the color conversion patterns.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 2 is a cross-sectional view taken along line I-I' of FIG. 1;

FIG. 3 is a cross-sectional view taken along line I-I' of FIG. 1 according to some embodiments;

FIG. 4 is a cross-sectional view taken along line I-I' of FIG. 1 according to some embodiments;

DETAILED DESCRIPTION

Embodiments of the present invention will be described with reference to the accompanying drawings so as to sufficiently understand constitutions and effects of the present invention. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. In the accompanying drawings, the components are shown enlarged for the sake of convenience of explanation, and the proportions of the components may be exaggerated or reduced for clarity of illustration.

Figure 1:
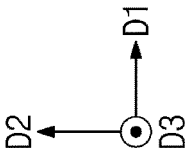
FIG. 1 is a plan view illustrating a display device according to an embodiment of the inventive concept.
Figure 2:
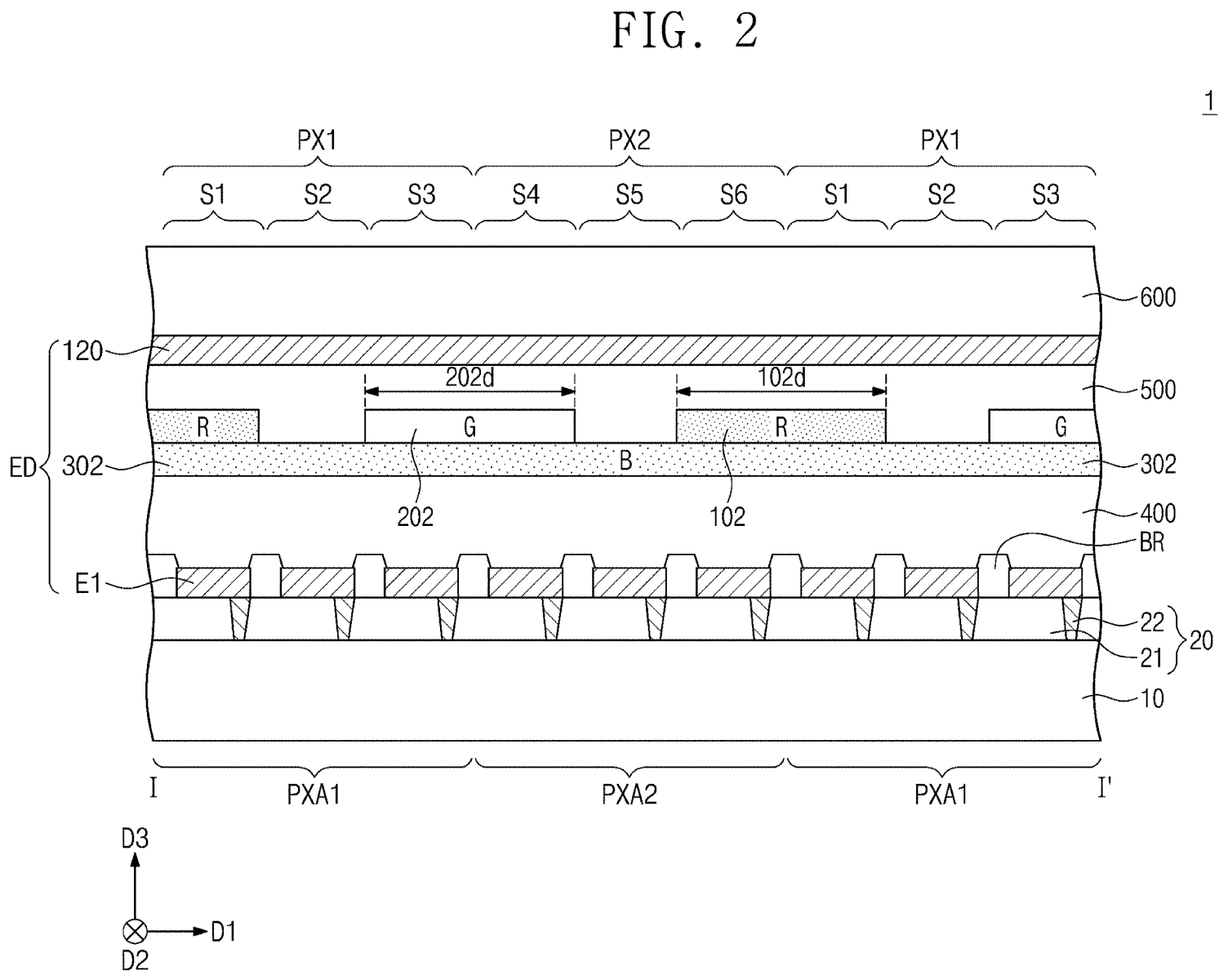

FIG. 1 is a plan view illustrating a display device according to an embodiment of the inventive concept. FIG. 2 is a cross-sectional view taken along line I-I' of FIG. 1.

Referring to FIGS. 1 and 2, a display device DP according to an embodiment of the inventive concept may include a substrate 10, a line layer 20, a light emitting element ED, a first common layer 400, a second common layer 500, and a thin-film encapsulation layer 600. The substrate 10 may be, for example, a semiconductor substrate on which a circuit layer including a CMOS circuit is disposed on an upper portion thereof. The circuit layer may include data lines, scan lines, capacitors, and a plurality of transistors.

The line layer 20 may include an insulating layer 21 and a line pattern 22 in the insulating layer 21. The line pattern 22 includes a via and may serve to electrically connect the circuit layer to the light emitting element ED.

The substrate 10 may include a first pixel area PXA1 and a second pixel area PXA2, which are repeatedly and alternately arranged in a first direction D1 parallel to a top surface of the substrate 10.

A first pixel PX1 and a second pixel PX2 may be disposed on the first pixel area PXA1 and the second pixel area PXA2, respectively.

The first pixel PX1 may include a first sub-pixel S1, a second sub-pixel S2, and a third sub-pixel S3, which are sequentially arranged in the first direction D1. The first to third sub-pixels S1 to S3 may be sub-pixels having different colors. For example, the first sub-pixel S1 may be a red sub-pixel R, the second sub-pixel S2 may be a blue sub-pixel B, and the third sub-pixel S3 may be a green sub-pixel G.

The second pixel PX2 may include a fourth sub-pixel S4, a fifth sub-pixel S5, and a sixth sub-pixel S6, which are sequentially arranged in the first direction D1. The fourth to sixth sub-pixels S4 to S6 may be sub-pixels having different colors. For example, the fourth sub-pixel S4 may be a green sub-pixel G, the fifth sub-pixel S5 may be a blue sub-pixel B, and the sixth sub-pixel S6 may be a red sub-pixel R.

Both the first pixel PX1 and the second pixel PX2 may be disposed so that the blue sub-pixel B is disposed between the red sub-pixel R and the green sub-pixel G.

As illustrated in FIG. 1, the first sub-pixel S1 and the sixth sub-pixel S6 may be sub-pixels having the same color (e.g., red color). The second sub-pixel S2 and the fifth sub-pixel S5 may be sub-pixels having the same color (e.g., blue color). The third sub-pixel S3 and the fourth sub-pixel 4 may be sub-pixels having the same color (e.g., green color).

The arrangement of the first sub-pixel S1, the second sub-pixel S2, and the third sub-pixels S3 may have a line symmetry relationship and a minor image relationship with respect to the arrangement between the fourth sub-pixel S4, the fifth sub-pixel S5, and the sixth sub-pixels, based on a virtual line between the first pixel PX1 and the second pixel PX2.

A plurality of first pixels PX1 may be arranged in a second direction D2 that is parallel to the top surface of the substrate 10 and crosses the first direction D1. A plurality of second pixels PX2 may be arranged in the second direction D2. For example, the red sub-pixels R arranged to be continuous in the second direction D2 may have a shape similar to a line extending in the second direction D2. That is, the first pixel PX1 and the second pixel PX2 may have a stripe pattern.

As illustrated in FIG. 2, three light emitting elements ED may be provided on each of the first pixel area PXA1 and the second pixel area PXA2. Each of the light emitting elements ED may include a first electrode E1, a second electrode E2, and an emission pattern between the first electrode E1 and the second electrode E2.

The first electrode E1 may be a pixel electrode and may function as, for example, an anode. The first electrodes E1 may be reflective electrodes. Each of the first electrodes E1 may include any one of Al, Al/Cu, and Al/TiN having high light reflectivity. Preferably, each of the first electrodes E1 may include Al/TiN. An insulating pattern BR may be disposed between the first electrodes E1 to prevent the pixel electrodes 201 from being in contact with each other.

The second electrode E2 may be disposed on the first electrode E1. The second electrode E2 may be a common electrode and may function as a cathode. The second electrode E2 may include at least one of a transparent conductive material (TCO) such as ITO and IZO that are capable of transmitting light or a semi-transmissive conductive material such as magnesium (Mg), silver (Ag), or an alloy of magnesium (Mg) and silver (Ag).

The emission pattern may include a blue emission layer 302 and may additionally include any one of a red emission pattern 102 and a green emission pattern 202. As will be described later, the emission pattern includes the blue emission layer 302, and the red emission pattern 102 and the green emission pattern 202 may be omitted (see FIG. 8). The emission pattern EP may include a host material and a dopant material. The emission pattern may be formed by using a phosphorescent or fluorescent emission material as a dopant in a host material. The blue emission layer 302 may vertically overlap the entirety of the first electrodes E1.

The red emission pattern 102 and the green emission pattern 202 may be provided on the blue emission layer 302. According to some embodiments, in reverse order, the red emission pattern 102 and the green emission pattern 202 may be provided under the blue emission layer 302.

The red emission pattern 102 may overlap the two first electrodes E1 vertically (in the third direction D3) in the first direction D1. The green emission pattern 202 may overlap the two first electrodes E1 vertically (in the third direction D3) in the first direction D1. One first electrode E1 may be disposed between the two first electrodes E1 overlapping vertically the red emission pattern 102 and the two first electrodes E1 overlapping vertically the green emission pattern 202. The red emission pattern 102 may be disposed on the first pixel area PXA1 and the second pixel area PXA2 at the same time. The green emission pattern 202 may be disposed on the first pixel area PXA1 and the second pixel area PXA2 at the same time. A width 102d of the red emission pattern 102 in the first direction D1 or a width 202d of the green emission pattern 202 in the first direction D1 may be greater about twice than a pixel pitch AP1 of FIG. 1. The pixel pitch AP1 may be the sum of a spaced distance between adjacent sub-pixels (e.g., S1 and S2) and a width of each of the sub-pixels (e.g., S1). A planar area of each of the red and green emission patterns 102 and 202 may be greater about twice than each of planar areas of the red and green sub-pixels R and G.

The first common layer 400 may be disposed between the first electrodes E1 and the emission pattern EP. The first common layer 400 may include a hole injection layer (not shown) and a hole transport layer (not shown). Each of the hole injection layer and the hole transport layer may be provided as a laminated structure or a single layer. In the case of the laminated structure, the hole injection layer may be disposed closer to the first electrodes E1, and the hole transport layer may be disposed farther from the first electrodes E1. The first common layer 401 may further include a hole buffer layer (not shown) or the like.

The second common layer 500 may be disposed between the emission pattern EP and the second electrode E2. The second common layer 500 may include an electron injection layer (not shown) and an electron transport layer (not shown). Each of the electron injection layer and the electron transport layer may be provided as a laminated structure or a single layer. In the case of the laminated structure, the electron injection layer may be disposed closer to the second electrode E2, and the electron transport layer may be disposed farther from the second electrode E2. The second common layer 500 may further include a layer such as a hole blocking layer.

The thin-film encapsulation layer 600 may be provided on the second electrode E2. The thin-film encapsulation layer 600 may include a single inorganic layer (not shown) or a first inorganic layer (not shown), an organic layer (not shown), and a second inorganic layer (not shown), which are sequentially laminated. The organic layer may be disposed between the first inorganic layer and the second inorganic layer. The first inorganic layer and the second inorganic layer may be formed by depositing an inorganic material, and the organic layer may be formed by depositing, printing, or applying an organic material. The inorganic layer (the single inorganic layer, the first inorganic layer, and the second inorganic layer) may protect the organic emission layer against moisture and oxygen, and the organic layer may protect the organic emission layer against foreign substances such as dust particles.

Figure 3:
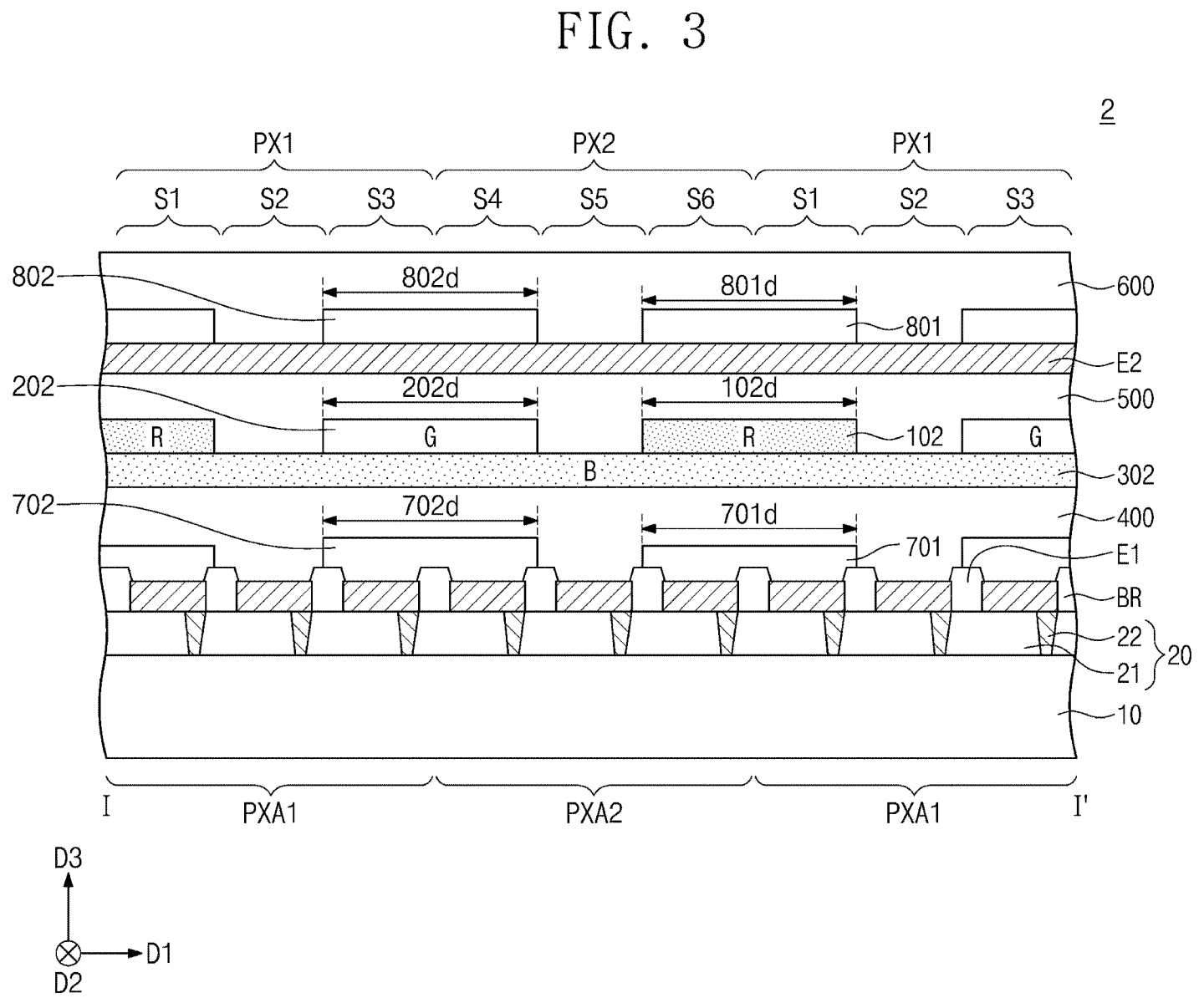

FIG. 3 is a cross-sectional view taken along line I-I' of FIG. 1 according to some embodiments. Since the above-described contents have been described in FIGS. 1 and 2 except for following contents to be described below, the duplicated contents will be omitted.

Referring to FIGS. 1 and 3, a display device according to some embodiments may further include a first resonance control pattern 701, a first reflection control pattern 801, a second resonance control pattern 702, and a second reflection control pattern 802. The first resonance control pattern 701 and the first reflection control pattern 801 may vertically overlap the red emission pattern 102. The second resonance control pattern 702 and the second reflection control pattern 802 may vertically overlap the green emission pattern 202. The first resonance control pattern 701 may be provided on the two first electrodes E1 that vertically overlap the red emission pattern 102. The two first electrodes E1 may be spaced apart from the first common layer 400 with the first resonance control pattern 701 therebetween. The second resonance control pattern 702 may be selectively provided on the two first electrodes E1 that vertically overlap the green emission pattern 202. The two first electrodes E1 may be spaced apart from the first common layer 400 with the first resonance control pattern 701 therebetween. The first reflection control pattern 801 may be provided on a portion of the second electrode E2 that vertically overlaps the red emission pattern 102. The second reflection control pattern 802 may be selectively provided on a portion of the second electrode E2 that vertically overlaps the green emission pattern 202. Each of the first and second resonance control patterns 701 and 702 may include at least one of an organic semiconductor layer, a transparent conductive material, or a transparent insulating material. For example, each of the resonance control patterns 701 and 702 may be a single layer including a transparent conductive material. As another example, each of the resonance control layer patterns 701 and 702 may be a double layer in which an insulating layer including a transparent insulating material and a conductive layer including a transparent conductive material are sequentially laminated (not shown). The organic semiconductor layer may include an acrylic resin, a polyimide resin, a novolak-type phenolic resin, and the like. The transparent conductive material may include indium tin oxide (ITO) or indium zinc oxide (IZO). The transparent insulating material may include an inorganic thin film such as $SiO_2$ or SiNx.

The first and second resonance patterns 701 and 702 may have substantially the same refractive index. For example, each of the resonance control layers may have a refractive index of about 1.6 to about 1.9. Each of a width 701d of the first resonance control pattern 701 in the first direction D1 and a width 702d of the second resonance control pattern 702 in the first direction may be greater about twice than the pixel pitch AP1. A planar area of each of the first resonance control pattern 701 and the first reflection control pattern 801 may be greater about twice than that of the red sub-pixel R. The first resonance control pattern 701 and the second resonance control pattern 702 may be spaced apart from each other in the first direction D1. The first resonance control pattern 701 and the second resonance control pattern 702 may have different thicknesses. For example, the first resonance control pattern 701 may have a thickness corresponding to a red wavelength, and the second resonance control pattern 702 may have a thickness corresponding to a green wavelength. Each of the first and second reflection control patterns 801 and 802 may include insulating layers including at least one of a transparent conductive material (TCO) such as ITO and IZO that are capable of transmitting light or a semi-transmissive conductive material such as magnesium (Mg), silver (Ag), or an alloy of magnesium (Mg) and silver (Ag) or an insulating material such as SiO/SiN, $SiO_2$/organic thin film, and the like. The insulating layers may be formed by laminating insulating layers having different refractive indexes. Thus, each of the first and second reflection control patterns 801 and 802 may have high reflectance. For example, each of the first and second reflection control patterns 801 and 802 may have reflectance of about 40% to about 80%. Each of a width 801d of the first reflection control pattern 801 in the first direction D1 and a width 802d of the second reflection control pattern 802 in the first direction D1 may be greater about twice than the pixel pitch AP1. A planar area of each of the second resonance control pattern 702 and the second reflection control pattern 802 may be greater about twice than that of the green sub-pixel G. The first reflection control pattern 801 and the second reflection control pattern 802 may be spaced apart from each other in the first direction D1.

Figure 4:
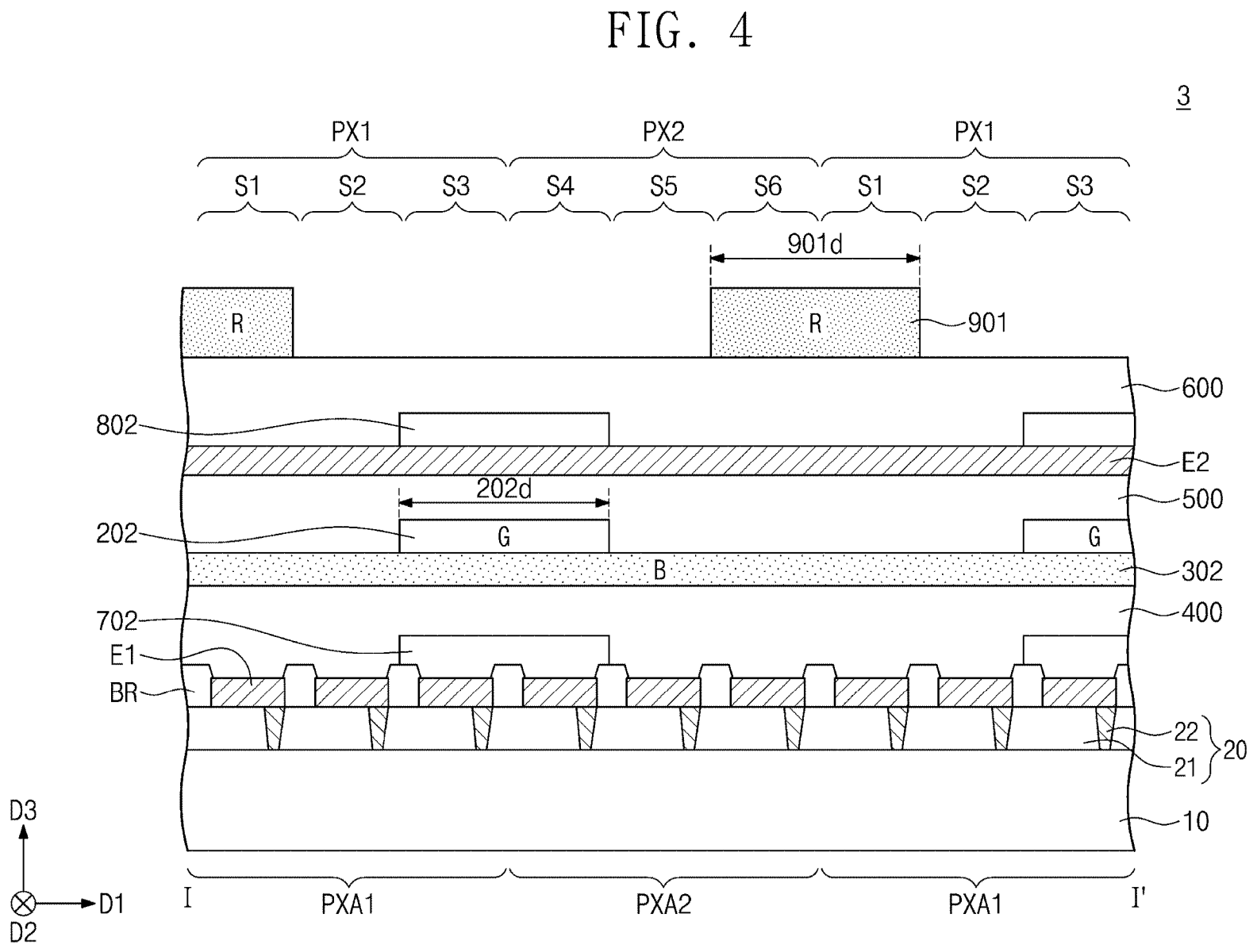

FIG. 4 is a cross-sectional view taken along line I-I' of FIG. 1 according to some embodiments. Since the above-described contents have been described in FIGS. 1 and 2 except for following contents to be described below, the duplicated contents will be omitted.

Referring to FIGS. 1 and 4, the red sub-pixel R may include one first electrode E1, a blue emission layer 302, a second electrode E2, and a red conversion pattern 901, which vertically overlap each other. The red emission pattern 102 may be omitted in this embodiment. The red conversion pattern 901 may be provided on the encapsulation layer 600. The red conversion pattern 902 may vertically overlap the two first electrodes E1 at the same time. When viewed in the plan view, the red conversion pattern 901 may be spaced apart from the green emission pattern 202 in the first direction D1.

The red conversion pattern 901 may be made of a quantum dot, a perovskite material, an inorganic phosphor, or a combination thereof, which absorbs blue light to emit red light. The red conversion pattern 901 may include nanoparticles of several hundred nm or less, and the nanoparticles may improve color conversion efficiency. A width 901d of the red conversion pattern 901 may be greater about twice than the pixel pitch AP1.

Figure 5:
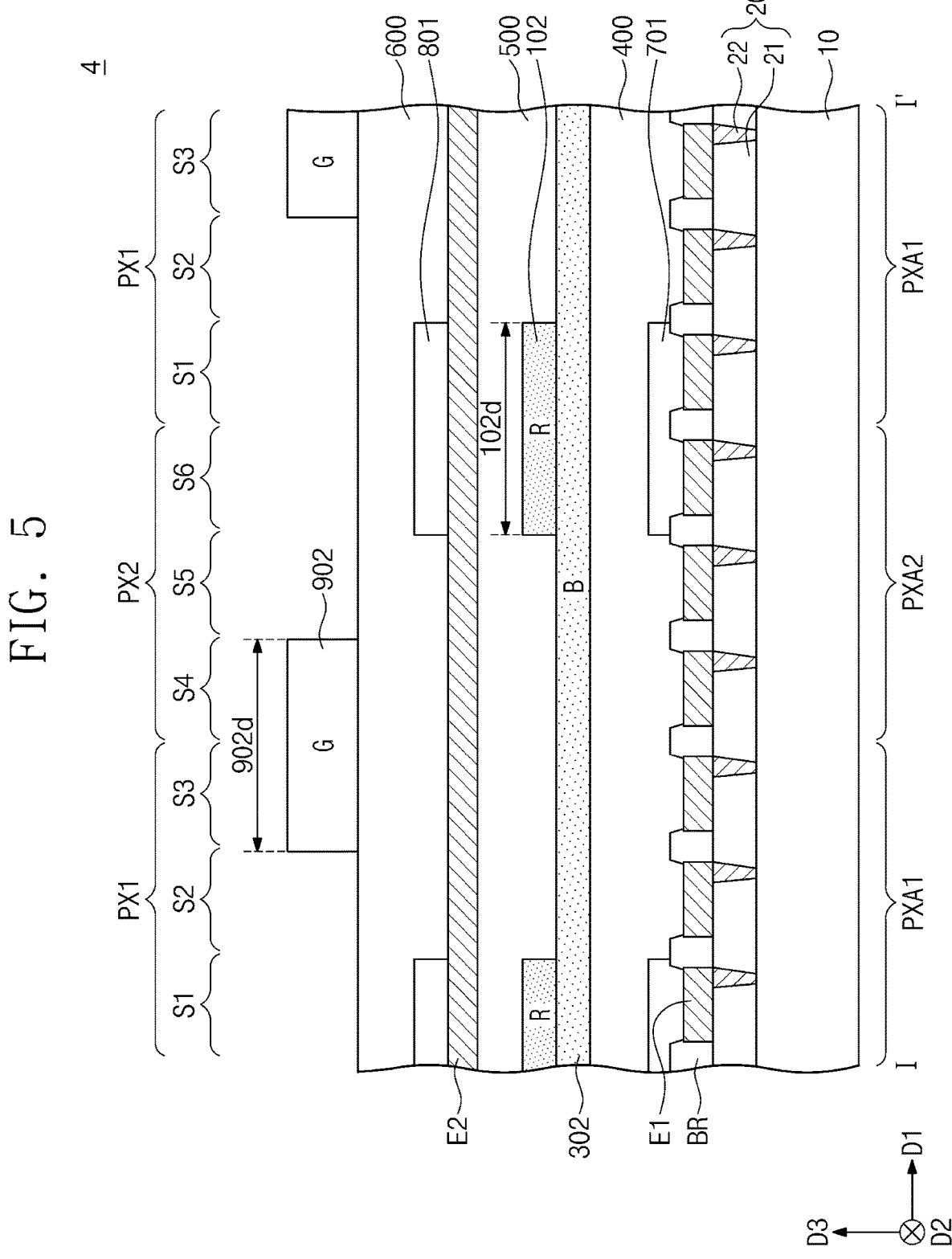
FIG. 5 is a cross-sectional view taken along line I-I' of FIG. 1 according to some embodiments.

FIG. 5 is a cross-sectional view taken along line I-I' of FIG. 1 according to some embodiments. Since the above-described contents have been described in FIGS. 1 and 2 except for following contents to be described below, the duplicated contents will be omitted.

Referring to FIGS. 1 and 5, the green sub-pixel G includes one first electrode E1, a blue emission layer 302, a second electrode E2, and a green conversion pattern 902, which vertically overlap each other. The green emission pattern 202 may be omitted in this embodiment. The green conversion pattern 902 may be provided on the encapsulation layer 600. The green conversion pattern 902 may vertically overlap the two first electrodes E1 at the same time. When viewed in the plan view, the green conversion pattern 902 may be spaced apart from the red emission pattern 102 in the first direction D1.

The green conversion pattern 902 may be made of a quantum dot, a perovskite material, an inorganic phosphor, or a combination thereof, which absorbs green light to emit red light. The green conversion pattern 902 may include nanoparticles of several hundred nm or less, and the nanoparticles may improve color conversion efficiency. A width 902d of the green conversion pattern 902 may be greater about twice than the pixel pitch AP1.

Figure 6:
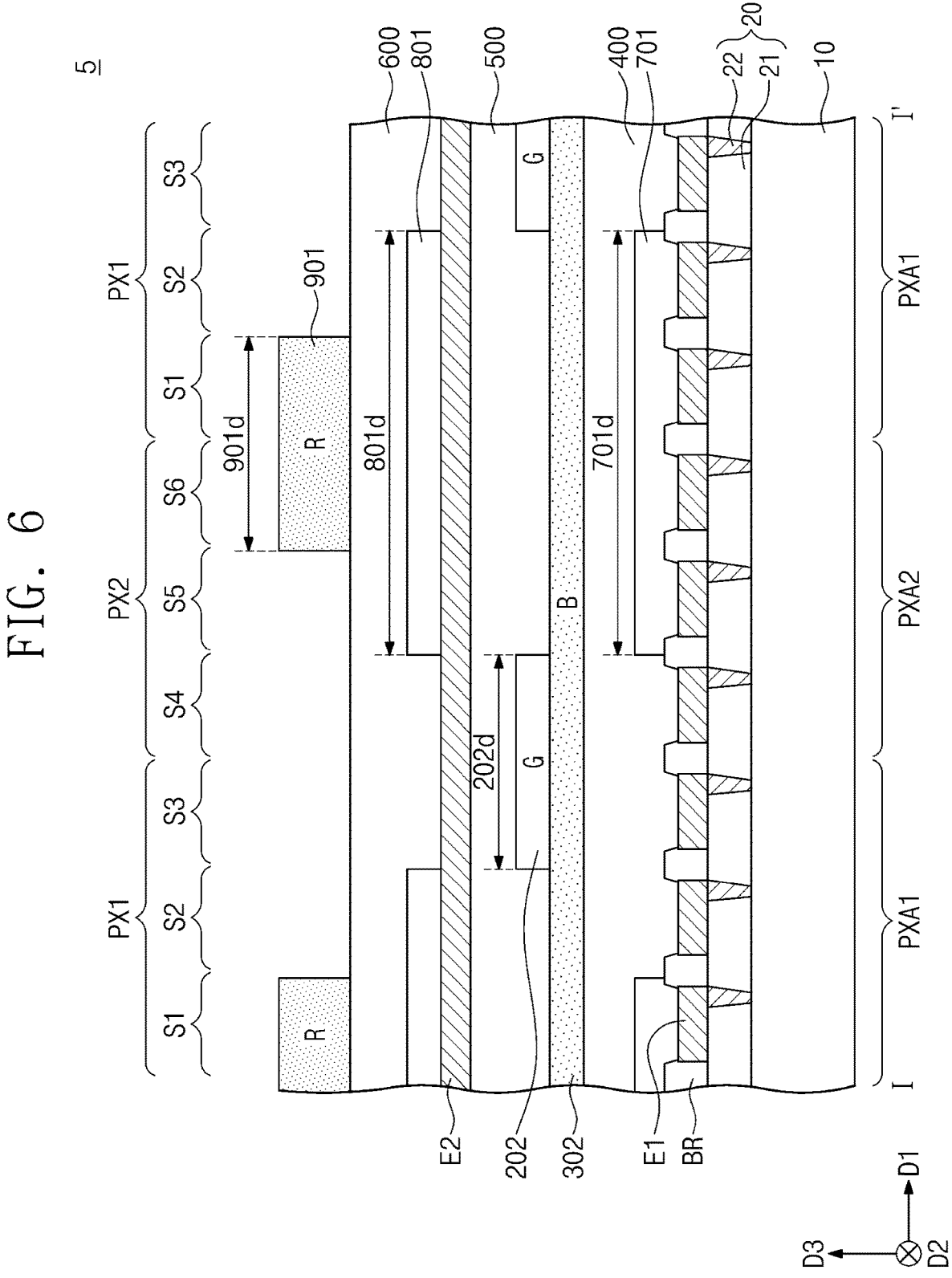
FIG. 6 is a cross-sectional view taken along line I-I' of FIG. 1 according to some embodiments.

FIG. 6 is a cross-sectional view taken along line I-I' of FIG. 1 according to some embodiments. Since the above-described contents have been described in FIGS. 1 and 2 except for following contents to be described below, the duplicated contents will be omitted.

Referring to FIGS. 1 and 6, the blue sub-pixel B may include one first electrode E1, a blue emission layer 302, a first resonance control pattern 701, a first reflection control pattern 801, and a second electrode E2, which vertically overlap each other. The red sub-pixel R may include one first electrode E1, a first resonance control pattern 701, a blue emission layer 302, a second electrode E2, a first reflection control pattern 801, and a red conversion pattern 901, which vertically overlap each other. The red emission pattern 102 may be omitted in this embodiment.

The first resonance control pattern 701 may vertically overlap four consecutive first electrodes E1 in the first direction D1. The first reflection control pattern 801 may vertically overlap four first electrodes E1. The first resonance control pattern 701 and the first reflection control pattern 801 may extend up to an area on which the adjacent blue sub-pixel B is disposed. That is, the blue sub-pixel B and the red sub-pixel R may share the first resonance control pattern 701 and the first reflection control pattern 801. The first resonance control pattern 701 and the first reflection control pattern 801 may not vertically overlap the green emission pattern 202.

The width 701d of the first resonance control pattern 701 may be greater about 4 times than the pixel pitch AP1 and the planar area of the first resonance control pattern 701 may be greater about 4 times than the planar area of the sub-pixel (e.g., R). The width 801d of the first reflection control pattern 801 may be greater about 4 times than the pixel pitch AP1, and the planar area of the first reflection control pattern 801 may be greater about 4 times than the planar area of the sub-pixel (e.g., R).

Figure 7:
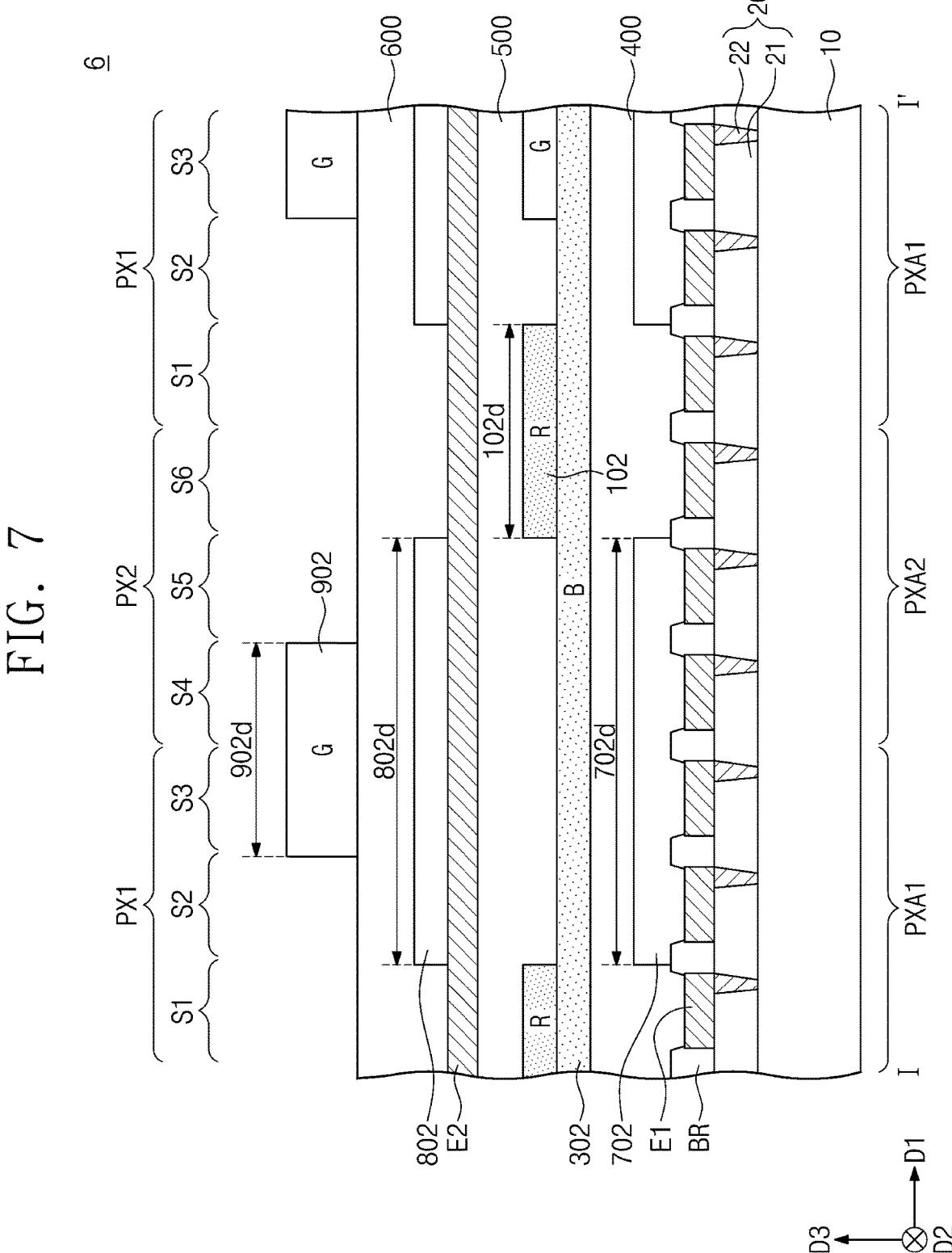
FIG. 7 is a cross-sectional view taken along line I-I' of FIG. 1 according to some embodiments.

FIG. 7 is a cross-sectional view taken along line I-I' of FIG. 1 according to some embodiments. Since the above-described contents have been described in FIGS. 1 and 2 except for following contents to be described below, the duplicated contents will be omitted.

Referring to FIGS. 1 and 7, the blue sub-pixel B may include one first electrode E1, a blue emission layer 302, a second resonance control pattern 702, a second reflection control pattern 802, and a second electrode E2, which vertically overlap each other. The green sub-pixel G may include one first electrode E1, a second resonance control pattern 702, a blue emission layer 302, a second electrode E2, a second reflection control pattern 802, and a green conversion pattern 902, which vertically overlap each other. The green emission pattern 202 may be omitted in this embodiment.

The second resonance control pattern 702 may vertically overlap four consecutive first electrodes E1 in the first direction D1. The second reflection control pattern 802 may vertically overlap four first electrodes E1. The second resonance control pattern 702 and the second reflection control pattern 802 may extend up to an area on which the adjacent blue sub-pixel B is disposed. That is, the blue sub-pixel B and the green sub-pixel R may share the second resonance control pattern 702 and the second reflection control pattern 802. The second resonance control pattern 702 and the second reflection control pattern 802 may not vertically overlap the red emission pattern 102.

The width 701*d* of the first resonance control pattern 701 may be greater about 4 times than the pixel pitch AP1 and the planar area of the first resonance control pattern 701 may be greater about 4 times than the planar area of the sub-pixel (e.g., G). The width 801*d* of the first reflection control pattern 801 may be greater about 4 times than the pixel pitch AP1, and the planar area of the first reflection control pattern 801 may be greater about 4 times than the planar area of the sub-pixel (e.g., G).

Figure 8:
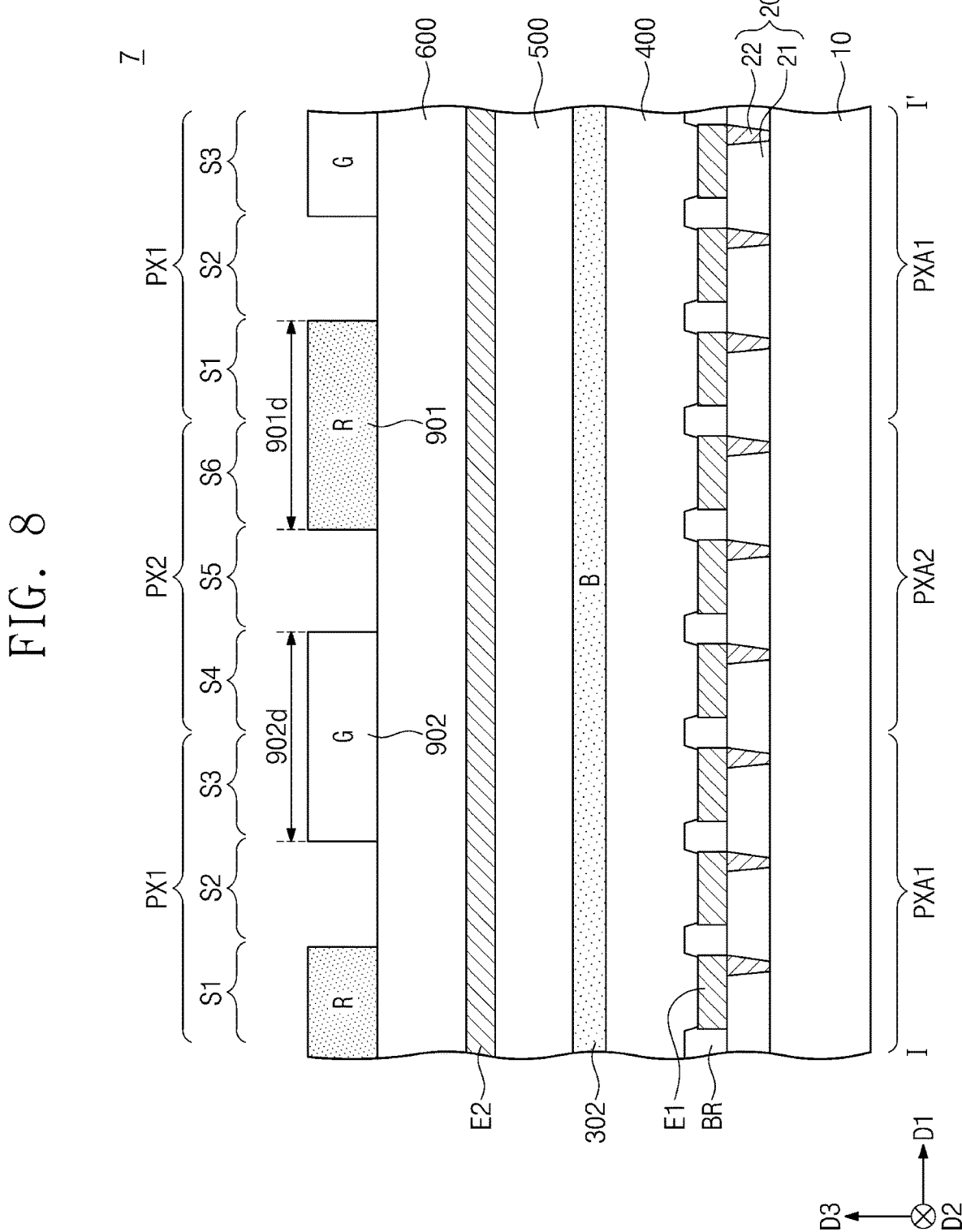
FIG. 8 is a cross-sectional view taken along line I-I' of FIG. 1 according to some embodiments.

FIG. 8 is a cross-sectional view taken along line I-I' of FIG. 1 according to some embodiments. Since the above-described contents have been described in FIGS. 1 and 2 except for following contents to be described below, the duplicated contents will be omitted.

Referring to FIGS. 1 and 8, in the display device 7 according to some embodiments, the green light emission pattern and the red light emission pattern may be omitted, and the red conversion pattern 901 and the green conversion pattern 902 may be provided instead of the green light emission pattern and the red light emission pattern. The red conversion pattern 901 and the green conversion pattern 902 may be provided on the encapsulation layer 600. Two adjacent red sub-pixels S1 and S6 of the first pixel PX1 and the second pixel PX2 may share one red conversion pattern 901. Two adjacent green sub-pixels S3 and S4 of the first pixel PX1 and the second pixel PX2 may share one green conversion pattern 902. Each of the width 901*d* of the red conversion pattern 901 in the first direction D1 and the width 902*d* of the green conversion pattern 902 in the first direction D1 may be greater twice than the pixel pitch AP1.

Figure 9:
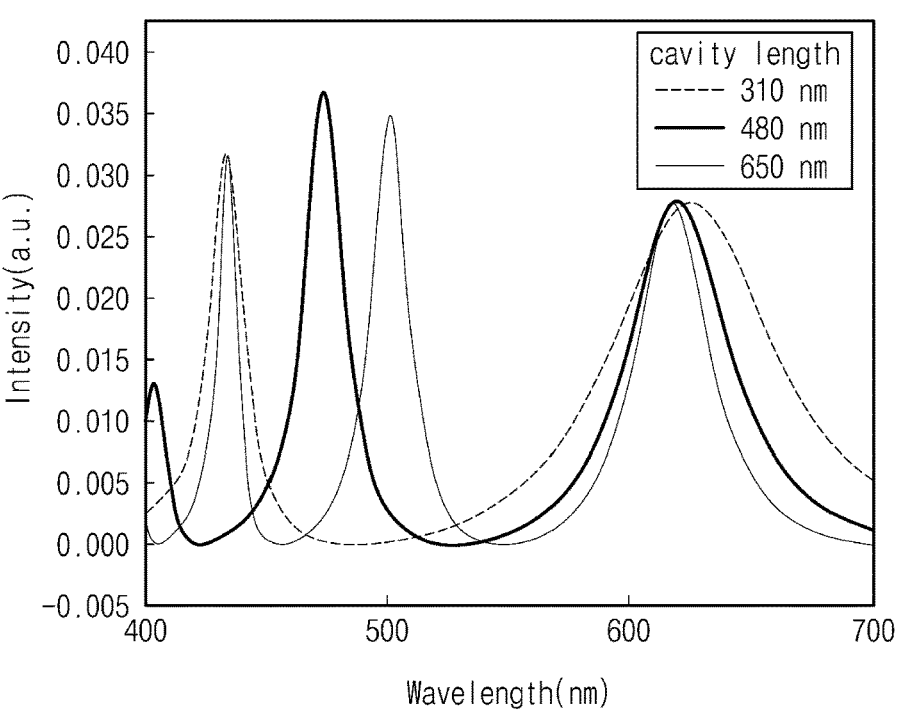
FIGS. 9 and 10 are graphs illustrating a resonance wavelength band depending on a cavity length according to an embodiment of the inventive concept.
Figure 10:
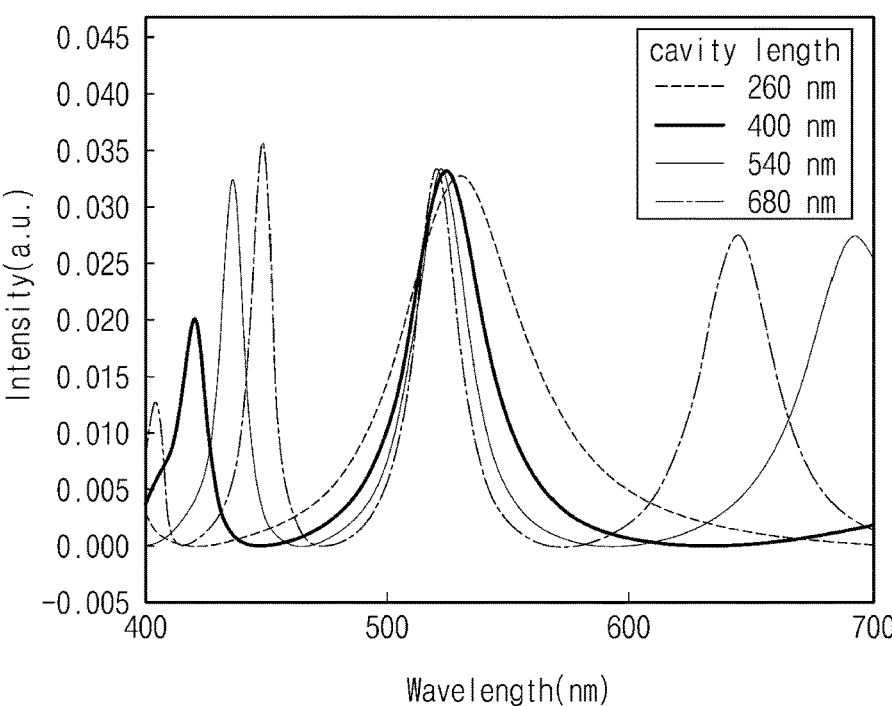

FIGS. 9 and 10 are graphs illustrating a resonance wavelength band depending on a cavity length according to an embodiment of the inventive concept.

Referring to graphs of FIGS. 9 and 10, a wavelength band of light that resonates according to a cavity length in an embodiment of the inventive concept will be described in detail.

When a cavity length is about 310 nm and about 480 nm to about 650 nm, light having a red wavelength band may become stronger (FIG. 9), and when the cavity length is about 260 nm and about 400 nm to about 540 nm, light having a green wavelength band may become stronger (FIG.

10). When each of the red sub-pixel and the green sub-pixel includes a first resonance control pattern and a second resonance control pattern, a thickness of the first resonance control pattern and a thickness of the second resonance control pattern may be different from each other. A cavity length of the red sub-pixel may be within 310 nm, and a cavity length of the green sub-pixel may be within 400 nm so that the blue light does not leak out. In this case, since the cavity length of the blue sub-pixel is about 100 nm or more, the resonance control layers having thicknesses of about 210 nm or less and about 300 nm or less may be formed on the red sub-pixel and the green sub-pixel, respectively.

Typically, in the case of forming the green emission pattern and/or the red emission pattern on the blue emission layer, a deposition process of an organic light emitting material has been used. In the case of the deposition process, since the width of the sub-pixel is substantially equal to a width of an opening of a shadow mask, it is difficult to control patterning as a pitch of the sub-pixel to be formed is more fine.

In the display device according to an embodiment of the inventive concept, the emission pattern may be formed to be greater about twice than the sub-pixel pitch through the shadow mask. In the case of the deposition process using the shadow mask (for example, a fine metal mask), the smaller the pixel pitch to be formed, the more difficult it is to control the patterning. Thus, the light emitting material may be deposited with the double width, the pixel may be easily controlled to be formed with the fine pitch.

As a result, it is possible to implement a high-resolution display device by forming the red sub-pixel, the green sub-pixel, and the blue sub-pixels, which have fine widths. This may be applied not only to the emission pattern but also to the resonance control pattern, the reflectance control pattern, and the color conversion pattern, thereby improving the high resolution performance of the high-resolution display device.

According to the embodiments of the inventive concept, the pixel arrangement may be adjusted to implement the display device having the high resolution.

Although the embodiment of the inventive concept is described with reference to the accompanying drawings, those with ordinary skill in the technical field of the inventive concept pertains will be understood that the present disclosure can be carried out in other specific forms without changing the technical idea or essential features. Therefore, the above-disclosed embodiments are to be considered illustrative and not restrictive.

What is claimed is:

1. A display device comprising:
a substrate comprising a first pixel area and a second pixel area, which correspond to a first pixel and a second pixel, respectively, wherein the first pixel area and the second pixel area are alternately and repeatedly disposed in a first direction parallel to a top surface of the substrate;
a first pixel electrode, a second pixel electrode, and a third pixel electrode on the first pixel area, which correspond to a first sub-pixel, a second sub-pixel, and a third sub-pixel, which are disposed in the first direction, respectively, wherein the first pixel comprises the first sub-pixel, the second sub-pixel, and the third sub-pixel;
a fourth pixel electrode, a fifth pixel electrode, and a sixth pixel electrode on the second pixel area, which correspond to a fourth sub-pixel, a fifth sub-pixel, and a sixth sub-pixel, which are disposed in the first direction, respectively, wherein the second pixel comprises the fourth sub-pixel, the fifth sub-pixel, and the sixth sub-pixel;

a blue emission layer on the first to sixth pixel electrodes;

one of a red emission pattern and a green emission pattern on the blue emission layer; and a common electrode vertically spaced apart from the first to sixth pixel electrodes with the blue emission layer therebetween, wherein the third pixel electrode and the fourth pixel electrode are disposed adjacent to each other, and the one of the red emission pattern and the green emission pattern vertically overlaps the third pixel electrode and the fourth pixel electrode, and another of the red emission pattern and the green emission pattern continuously extends from the first pixel area to the second pixel area.

2. The display device of claim 1, wherein the first to third sub-pixels comprise sub-pixels having colors different from each other, and the fourth to sixth sub-pixels comprises pixels having colors different from each other, the third sub-pixel and the fourth sub-pixel comprise pixel which are disposed adjacent to each other and have a same color, and each of the second sub-pixel and the fifth sub-pixel comprises a blue sub-pixel.

3. The display device of claim 1, wherein each of the first sub-pixel and the sixth sub-pixel comprises one of a red sub-pixel and a green sub-pixel, and each of the third sub-pixel and the fourth sub-pixel comprises the other of the red sub-pixel and the green sub-pixel.

4. The display device of claim 1, wherein a width of the one of the red emission pattern and the green emission pattern in the first direction is greater twice than a pixel pitch of each of the first to sixth sub-pixels in the first direction.

5. The display device of claim 1, further comprising the other of the red emission pattern and the green emission pattern on the blue emission layer, wherein the second pixel electrode and the fourth pixel electrode do not vertically overlap the red emission pattern and the green emission pattern.

6. The display device of claim 1, further comprising a resonance control pattern between the third and fourth pixel electrodes and the blue emission layer, wherein the resonance control pattern vertically overlaps the one of the red emission pattern and the green emission pattern.

7. The display device of claim 1, further comprising one of a red conversion pattern and a green conversion pattern on the common electrode, wherein, in a planar respective, the one of the red emission pattern and the green emission pattern is spaced apart from the one of the red conversion pattern and the green conversion pattern in the first direction.

8. The display device of claim 7, wherein a first width of the one of the red emission pattern and the green emission pattern in the first direction is substantially the same as a second width of the one of the red conversion pattern and the green conversion pattern in the first direction.

9. The display device of claim 8, further comprising a resonance control pattern between the first, second, fifth, and sixth pixel electrodes and the blue emission layer, wherein a third width of the resonance control pattern in the first direction is greater about twice than each of the first width and the second width.

10. The display device of claim 7, further comprising the other of the red emission pattern and the green emission pattern on the blue emission layer, wherein the second pixel electrode and the fourth pixel electrode do not vertically overlap the red emission pattern and the green emission pattern.

11. The display device of claim 1, further comprising a reflection control layer on the common electrode, wherein the reflection control layer vertically overlaps the one of the red emission pattern and the green emission pattern.

12. The display device of claim 1, further comprising color conversion patterns on the common electrode, wherein the color conversion patterns vertically overlap the first pixel electrode and the sixth pixel electrode and are spaced apart from each other in the first direction, and the second pixel electrode and the fourth pixel electrode do not vertically overlap the one of the red emission pattern and the green emission pattern and the color conversion patterns.

* * * * *